United States Patent
Anazawa

(10) Patent No.: US 7,539,964 B2
(45) Date of Patent: May 26, 2009

(54) CELL PLACEMENT TAKING INTO ACCOUNT CONSUMED CURRENT AMOUNT

(75) Inventor: Tetsuya Anazawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 9 days.

(21) Appl. No.: 11/444,399

(22) Filed: Jun. 1, 2006

(65) Prior Publication Data
US 2007/0220471 A1 Sep. 20, 2007

(30) Foreign Application Priority Data
Mar. 20, 2006 (JP) ............................. 2006-076777

(51) Int. Cl.
*G06F 17/50* (2006.01)
(52) U.S. Cl. .................. 716/10; 716/8; 716/9; 716/11
(58) Field of Classification Search ................. 716/10, 716/9, 8, 11
See application file for complete search history.

(56) References Cited

U.S. PATENT DOCUMENTS

| | | | |
|---|---|---|---|
| 6,066,177 A * | 5/2000 | Hatsuda ........................ 703/19 |
| 6,118,334 A * | 9/2000 | Tanaka et al. ................ 327/565 |
| 6,336,207 B2 * | 1/2002 | Shinomiya et al. ............ 716/11 |
| 6,405,354 B1 * | 6/2002 | Itazu et al. ...................... 716/8 |
| 6,604,066 B1 * | 8/2003 | Hatsuda ........................ 703/19 |
| 6,675,139 B1 * | 1/2004 | Jetton et al. ................... 703/17 |
| 7,155,684 B2 * | 12/2006 | Kusumoto ...................... 716/1 |

FOREIGN PATENT DOCUMENTS

| JP | 04-287945 | 10/1992 |
|---|---|---|
| JP | 07-106533 | 4/1995 |
| JP | 11-087518 | 3/1999 |
| JP | 2000020576 A * | 1/2000 |

* cited by examiner

*Primary Examiner*—Sun J Lin
(74) *Attorney, Agent, or Firm*—Arent Fox LLP

(57) ABSTRACT

A computer-readable record medium having a program embodied therein for causing a computer to place cells. The program includes codes for causing the computer to perform deriving an amount of current consumed by each cell constituting a net list, placing a cell of interest in a layout plane while securing around the cell of interest an area having a size that is responsive to the derived amount of current consumed by the cell of interest and that is larger than an actual size of the cell of interest, and placing other cells such that any other cells than the cell of interest are not placed in the area.

10 Claims, 11 Drawing Sheets

CELL PLACEMENT TAKING INTO ACCOUNT CONSUMED CURRENT AMOUNT

CROSS-REFERENCE TO RELATED APPLICATIONS

The present application is based upon and claims the benefit of priority from the prior Japanese Patent Application No. 2006-076777 filed on Mar. 20, 2006, with the Japanese Patent Office, the entire contents of which are incorporated herein by reference.

BACKGROUND OF THE INVENTION

1. Field of the Invention

The present invention generally relates to computer-aided design apparatuses and computer-aided design methods, and particularly relates to a cell placement apparatus and a cell placement method.

2. Description of the Related Art

When a semiconductor integrated circuit is to be designed, power supply lines are designed first, and, then, cells are placed, followed by checking whether the consumption of electric currents by the cells satisfies predetermined requirements. To this end, the consumption of electric currents is calculated through current consumption analysis at a certain step of the designing process, and design modification is made based on the results of calculation.

As the operating frequency of semiconductor integrated circuits increases, or as the probability of cell-state transition (operating rate) increases, the consumption of currents flowing through cells and power supply lines coupled to the cells also increases. Further, as the density of cell placement increases, the number of cells receiving currents from a given power supply line increases, resulting in a large amount of current running through the power supply line. Because of this, the amount of electric current running through a given power supply line may exceed the maximum tolerable current amount of this power supply line (which is the maximum amount of electric current that can be allowed to flow through this power supply line). As a result, if the amount of electric current is extremely large, the power supply line may be severed through an electro-migration phenomenon. In order to avoid this, a check is made after cell placement in the designing of semiconductor integrated circuits as to whether the amount of electric current flowing through a power supply line is no greater than the maximum tolerable current amount. If there is a portion where a current amount exceeds a maximum tolerable current amount, the design is modified.

Such design modification is largely classified into the two following methods. In the first method, one or more cells situated at a portion where the exceeding of a maximum tolerable current amount occurs are displaced to a portion where no exceeding of a maximum tolerable current amount is detected (Patent Document 1). In the second method, the width of the power supply line is expanded, or an interconnect line in another metal layer is used as a reinforcement for the power supply line, thereby to increase the maximum tolerable current amount of the power supply line (Patent Document 2). In these two methods, a check of the exceeding of a maximum tolerable current amount and the modification of the failed portion are performed repeatedly until no failed portion is detected.

In the first method, the displacement of one or more cells may create the exceeding of a maximum tolerable current amount at another place since the probability of exceeding of a maximum tolerable current amount is high at some portions in the semiconductor integrated circuit where the operating frequency and operating rate are high. Consequently, the TAT (turnaround time) required to eliminate the exceeding of a maximum tolerable current amount increases. Further, when the density of cell placement is high, it is difficult to find a proper place to move the cells upon the exceeding of a maximum tolerable current amount, which may results in the need to perform a full-scale modification of the cell placement. This further increases the TAT.

In the second method, the routing of signal interconnect lines may be hampered since the reinforcement of the power supply line reduces availability of routing channels at some portions in the semiconductor integrated circuit where the operating frequency and operating rate are high. Moreover, depending on the amount of current consumed at a portion where the exceeding of a maximum tolerable current amount is detected, the reinforcement of the power supply line may create the exceeding of a maximum tolerable current amount at another portion (e.g., a portion closer to the source of power supply than is the point of reinforcement), which further increases the TAT required to eliminate the exceeding of a maximum tolerable current amount.

As a scheme based on another viewpoint, there is a method that determines the position of cell placement based on a ratio between power supply line resistances in two different layers (Patent Document 3). Since a checked value is a ratio of power supply line resistances (relative value) rather than a tolerable current amount (absolute value), the first method or the second method still needs to be utilized to modify the portions where the exceeding of a maximum tolerable current amount is detected, despite the fact that the shortening of the TAT is achievable to some extent by restricting the initial placement of cells to reduce the number of the portions where the exceeding of a maximum tolerable current amount occurs.

[Patent Document 1] Japanese Patent Application Publication No. 11-87518

[Patent Document 2] Japanese Patent Application Publication No. 04-287945

[Patent Document 3] Japanese Patent Application Publication No. 07-106533

Accordingly, there is a need for a cell placement scheme that achieves cell placement without increasing the TAT and without the exceeding of a maximum tolerable current amount.

SUMMARY OF THE INVENTION

It is a general object of the present invention to provide a cell placement scheme that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a cell placement scheme particularly pointed out in the specification in such full, clear, concise, and exact terms as to enable a person having ordinary skill in the art to practice the invention.

To achieve these and other advantages in accordance with the purpose of the invention, the invention provides a computer-readable record medium having a program embodied therein for causing a computer to place cells, the program including codes for causing the computer to perform deriving an amount of current consumed by each cell constituting a net list, placing a cell of interest in a layout plane while securing around the cell of interest an area having a size that is responsive to the derived amount of current consumed by the cell of interest and that is larger than an actual size of the cell of interest, and placing other cells such that any other cells than the cell of interest are not placed in the area.

According to another aspect of the present invention, an apparatus for placing cells includes a memory to store information about a circuit to be designed and a cell placement program, and a computation unit to execute the cell placement program stored in the memory so as to place cells of the circuit to be designed in a layout plane by use of the information stored in the memory, wherein the computation unit executes the cell placement program to perform deriving an amount of current consumed by each cell constituting the circuit to be designed, placing a cell of interest in a layout plane while securing around the cell of interest an area having a size that is responsive to the derived amount of current consumed by the cell of interest and that is larger than an actual size of the cell of interest, and placing other cells such that any other cells than the cell of interest are not placed in the area.

According to another aspect of the present invention, a method of placing cells includes deriving an amount of current consumed by each cell constituting a net list, placing a cell of interest in a layout plane while securing around the cell of interest an area having a size that is responsive to the derived amount of current consumed by the cell of interest and that is larger than an actual size of the cell of interest, and placing other cells such that any other cells than the cell of interest are not placed in the area.

According to at least one embodiment of the present invention, cells are placed by taking into account the amount of current consumed by each cell, so that a single cell placement process can bring about a cell placement that is free from the exceeding of a maximum tolerable current amount. Since there is no need to check, after cell placement, whether there is a portion where the exceeding of a maximum tolerable current amount occurs, and to modify the design accordingly, the TAT can be significantly reduced. Further, the width of a power supply line is not broadened to end up reducing the availability of routing channels.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the present invention, at the step of cell placement, cells are placed while applying a placement restriction that takes into account the amount of electric current consumed by each cell, thereby ensuring that the amount of current consumed by placed cells does not exceed the maximum tolerable current amount per area of predetermined size in the chip (on the layout plane). To be specific, the maximum tolerable current amount is calculated with respect to a power supply line that supplies a power to an area of predetermined size. This can be calculated based on the width of the power supply line. Further, the amount of current consumed by each cell is obtained. The amount of current consumed by each cell is derived by use of a static analysis method based on the operating frequency of the cell, the operating rate (probability of cell-state transition), the power supply voltage of the cell, load capacitance, and the like. Cells are then placed based on the maximum tolerable current amounts and the amount of current consumed by each cell. When a given cell is to be placed, an area having the size responsive to the maximum tolerable current amount and the amount of current consumed by this cell is secured (set aside) at the position where this cell is placed, such that any other cells are not placed within this area. Cells are placed in this manner. Namely, the larger the amount of current consumption by a given cell, the larger the area secured for this cell. Cells are placed such that no other cells enter this secured area. The larger the maximum tolerable current amount, the smaller the area secured for a cell.

In this manner, cells are placed by taking into account a maximum tolerable current amount and the amount of current consumed by each cell, so that a single cell placement process can bring about a cell placement that is free from the exceeding of a maximum tolerable current amount. Since there is no need to check, after cell placement, whether there is a portion where the exceeding of a maximum tolerable current amount occurs, and to modify the design accordingly, the TAT can be significantly reduced. Further, the width of a power supply line is not broadened to end up reducing the availability of routing channels.

In the following, embodiments of the present invention will be described with reference to the accompanying drawings.

Figure 1:
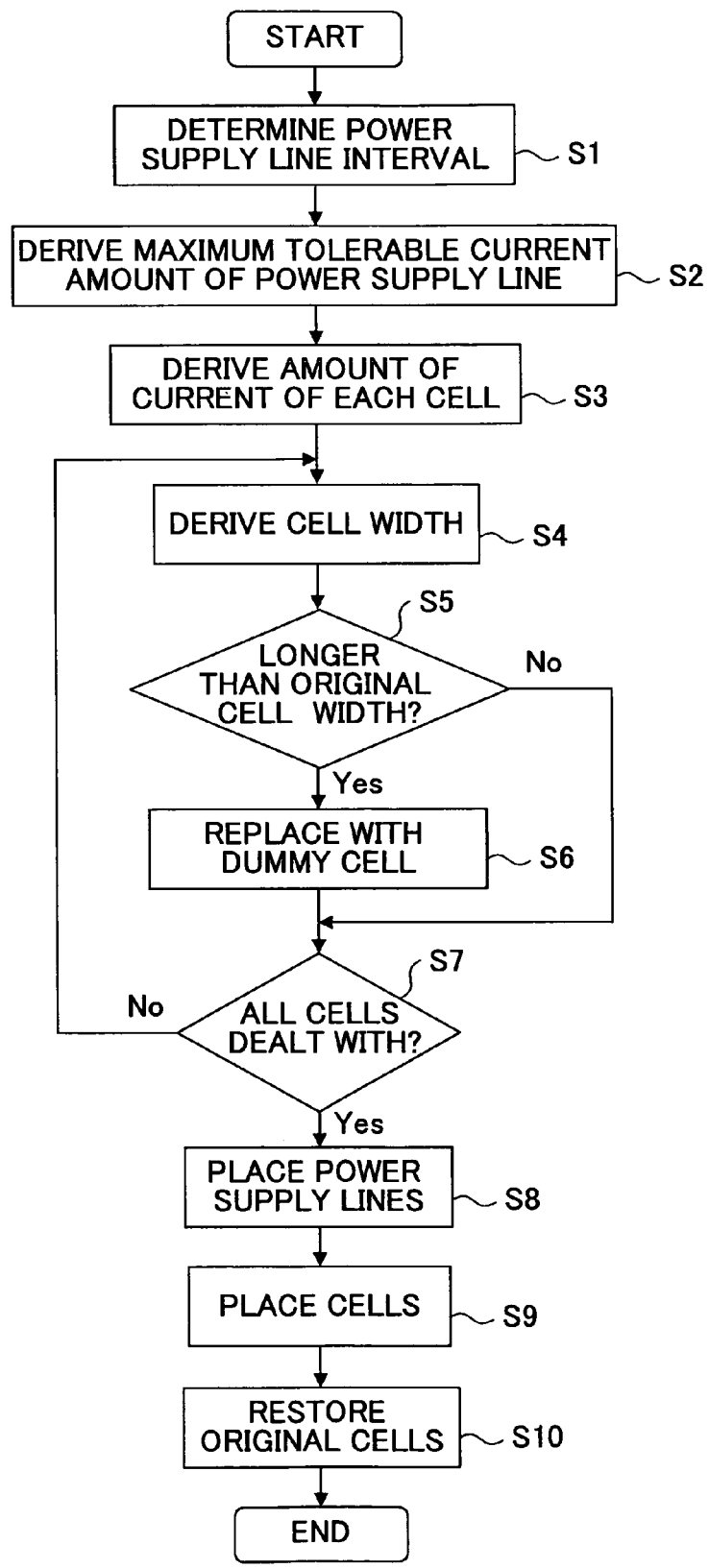
FIG. 1 is a flowchart showing a first embodiment of a cell placement method according to the present invention.

FIG. 1 is a flowchart showing a first embodiment of a cell placement method according to the present invention. At step S1, the interval of power supply lines is determined. At step S2, the maximum tolerable current amount is calculated with respect to power supply lines.

Figure 2:
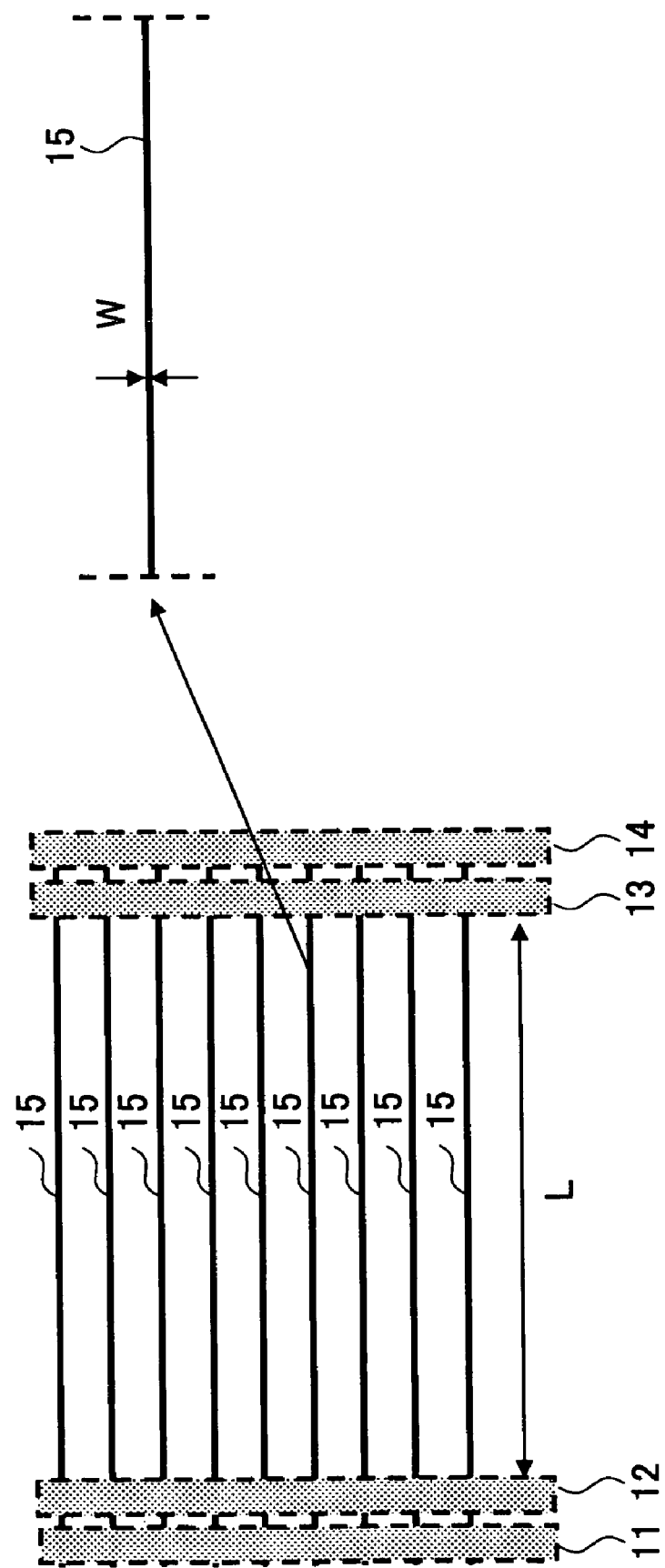
FIG. 2 is a drawing for explaining how to determine the interval of power supply lines and how to calculate the maximum tolerable current amount of power supply lines.

FIG. 2 is a drawing for explaining how to determine the interval of power supply lines and how to calculate the maximum tolerable current amount of power supply lines. FIG. 2 shows main power supply lines 11, 12, 13, and 14 (e.g., a portion of a power supply mesh), between which power supply lines 15 are placed. One of the main power supply lines 11 and 12 serves to supply a power supply potential VDD, and the other one serves to supply a ground potential VSS. By the same token, one of the main power supply lines 13 and 14 serves to supply the power supply potential VDD, and the other one serves to supply the ground potential VSS. The power supply lines 15 include lines for the power supply potential and lines for the ground potential, which are alternately arranged. At step S1 of FIG. 1, an interval L of the main power supply lines 11, 12, 13, and 14 shown in FIG. 2 (i.e., the width of an area to which one of the power supply lines 15 supplies the power) is determined. At step S2, the maximum tolerable current amount of the power supply lines 15 is derived based on the width W of each of the power supply lines 15. To be specific, the maximum tolerable current amount is calculated by taking into account the operating temperature, the semiconductor manufacturing process, and the power supply voltage conditions.

As will be described in the following, as a general rule, cells are arranged in a single row between two adjacent power supply lines 15 along these two power supply lines. The cells to which one of the power supply lines 15 supplies the power supply potential VDD are all the cells placed in the two rows on both sides of this power supply line 15. Accordingly, these cells need to be placed such that the total amount of current consumed by all of these cells does not exceed the maximum tolerable current amount of this power supply line 15.

Turning to FIG. 1 again, at step S3, the amount of current of each cell is calculated. A current consumed by each cell includes a current consumed inside the cell and a current for charging and discharging the load capacitance coupled to its output node. The current consumed inside the cell includes a current for charging/discharging the capacitance component existing in the cell and a through current that is created by an instantaneous short-circuiting of a pair of PMOS and NMOS transistors. It thus suffices to prepare information for each cell about the capacitance and the through currents inside the cell as a library. In order to obtain the current for charging/discharging the load capacitance coupled to the output node, it suffices to derive the load capacitance coupled to the output node based on the expected interconnect line capacitance and the capacitance of the input node(s) to which the output node is coupled.

The capacitance derived as described above is multiplied by the operating frequency of the cell, the operating rate (i.e., the probability of state transition inside the cell), and the power supply voltage of the cell so as to derive the amount of current resulting from the charging/discharging of the capacitance. As for the through current, further, the operating frequency of the cell, the operating rate, an average amount of through current, and a through current conduction time are multiplied so as to derive the amount of current attributable to the through current.

The operating frequency and operating rate of the cell are derived by defining the operating frequency (e.g., 50 MHz) and the operating rate (e.g., 0.2: operating for the duration of 0.2 T on average per unit time T) with respect to each clock signal and each data signal at the input side of the net list, and by tracing each of the signals from the input side to the output side with respect to each of the cells constituting the net list. Such procedure makes it possible to derive the operating frequency and operating rate of each input node and the operating frequency and operating rate of each output node with respect to a cell of interest.

Figure 3:
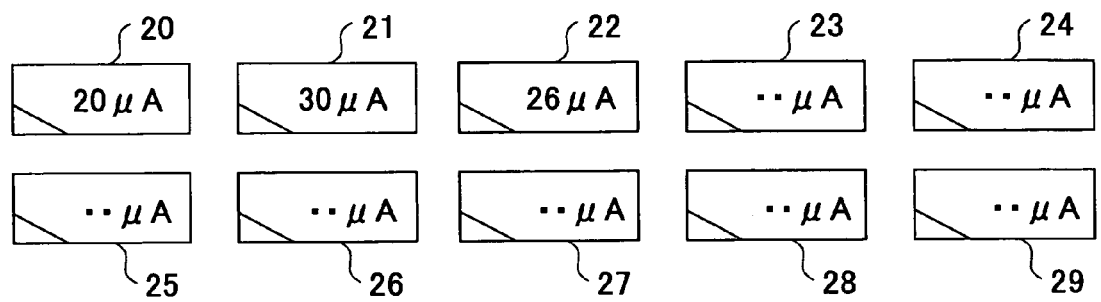
FIG. 3 is a drawing for explaining the calculation of the amount of current of each cell.

FIG. 3 is a drawing for explaining the calculation of the amount of current of each cell. FIG. 3 shows cells 20 through 29. The amount of current consumed by each cell is obtained as described above, resulting in 20 microampere being assigned to the cell 20 as the amount of consumed current, 30 microampere being assigned to the cell 21 as the amount of consumed current, and 26 microampere being assigned to the cell 22 as the amount of consumed current, for example. In the same manner, the amount of consumed current is obtained and assigned to each of the cells 23 through 29.

Turning to FIG. 1 again, at step S4, the width of a cell of interest is derived. As will later be described, for the purpose of cell placement in the first embodiment, each cell will be considered to have a cell width responsive to the amount of current consumed by the cell rather than the cell width of an actual cell (i.e., the circuit achieving the function of the cell). With this provision, each cell occupies in the layout area an area size responsive to the amount of its current consumption, thereby making it possible to limit the total amount of current consumed by all the cells existing per unit area.

Figure 4:
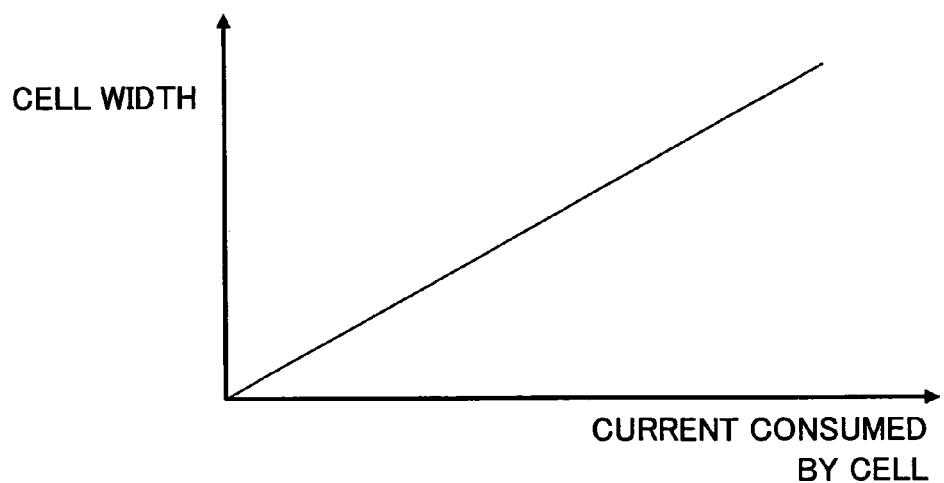
FIG. 4 is a drawing showing the relationship between the current consumed by cell and the cell width.

FIG. 4 is a drawing showing the relationship between the current consumed by cell and the cell width. In the present invention, the relationship between the current consumed by cell and the cell width is defined as a linear function as shown in FIG. 4, for example. The relationship between the current consumed by cell and the cell width as shown in FIG. 4 may be provided by preparing a table that has a plurality of data entry sets, each set being comprised of a single consumed current value and a single cell width. When the amount of current consumed by the cell of interest is obtained as shown in FIG. 3, a cell width corresponding to the amount of consumed current can be derived by using the relationship shown in FIG. 4 (or by use of the table as described above).

This cell width is responsive to the interval of power supply lines determined at step S1 and the maximum tolerable current amount derived at step S2. The larger the maximum tolerable current amount, the larger the total amount of current consumed by all the cells connected to the power supply line 15 can be. Namely, the number of cells arranged in a line (i.e., single row) between the two adjacent power supply lines 15 can be increased. In this case, therefore, the cell width should be set narrower. Further, even if the interval L of main power supply lines (i.e., the width of an area to which one of the power supply lines 15 supplies the power) as shown in FIG. 2 is widened, for example, the number of cells placed in a single row cannot be increased unless the maximum tolerable current amount of the one of the power supply lines 15 is changed. Accordingly, the cell width should be increased by a factor corresponding to the rate of widening of the power supply line interval L.

In this manner, the derived cell width decreases as the maximum tolerable current amount increases, and increases as the power supply line interval L increases. In order to implement the relationships between the derived cell width, the maximum tolerable current amount, and the power supply line interval L, the slope of the line specifying the relationship between the current consumed by cell and the cell width as shown in FIG. 4 may be adjusted in response to the maximum tolerable current amount and the power supply line interval L.

Turning to FIG. 1 again, at step S5, a check is made as to whether the derived cell width is wider than the original cell width. Namely, the width of the actual cell of the cell of interest is compared with the cell width derived at step S4, thereby determining which is wider. If the derived cell width is broader than the original cell width, the cell of interest is replaced with a dummy cell at step S6. That is, the cell of interest is switched from the actual cell to a dummy cell that has the derived cell width. If the derived cell width is not broader than the original cell width, the replacement with a dummy cell at step S6 is skipped.

Figure 5:
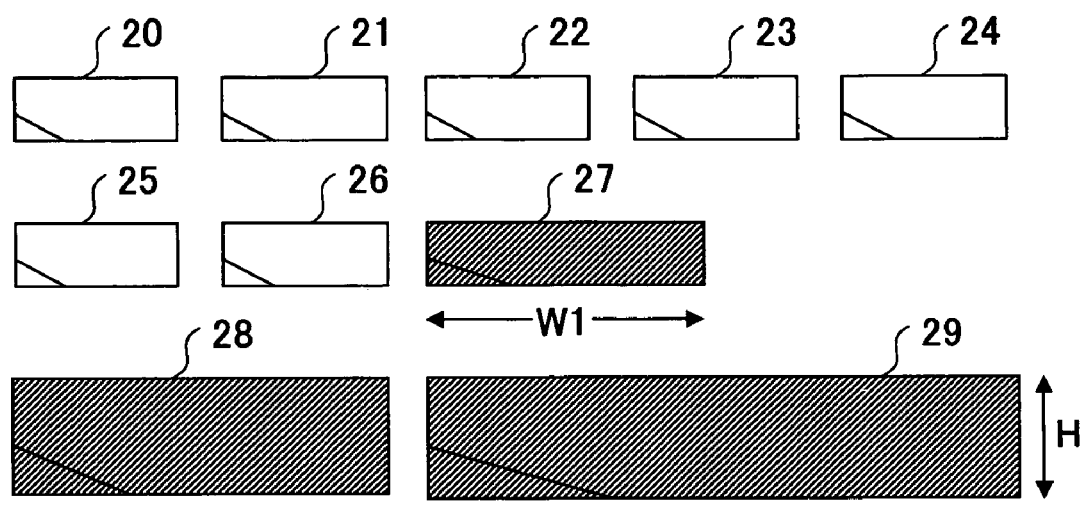
FIG. 5 is a drawing for explaining the change of cell width.

FIG. 5 is a drawing for explaining the change of cell width. In the example shown in FIG. 5, the cell widths of the cells 27 through 29 are changed among the cells 20 through 29, with the replacement of these cells by dummy cells (shown in hatches). Since the derived cell widths are not wider than the original cell widths, the cells 20 through 26 are not replaced with dummy cells.

In the example shown in FIG. 5, the width W1 of the cell 27 is wider than the width of the cell 27 shown in FIG. 3. This width W1 is the cell width derived at step S4. As for the cells 28 and 29, not only their widths are broadened, but also their height H is greater than the height of the cells 28 and 29 shown in FIG. 3. In the first embodiment, the height of a cell may be increased in this manner if the derived width is broader than a predetermined width (e.g., ½ of the power supply line interval L). If the derived width is not broader than the predetermined width (e.g., ½ of the power supply line interval L), the height of the cell remains the same as that of the original cell.

Turning to FIG. 1 again, at step S7, a check is made as to whether the processes of steps S4 through S6 are performed with respect to all the cells. If there is a cell yet to be processed, such an unprocessed cell is treated as a cell of interest, and the processes of the steps S4 through S6 will be performed. If the processes are completed with respect to all the cells, the procedure proceeds to step S8.

At step S8, the power supply lines are laid out. In so doing, the power supply lines are laid out so as to conform to the conditions of the power supply line interval and the power supply line width determined at steps S1 and S2, respectively.

Figure 6:
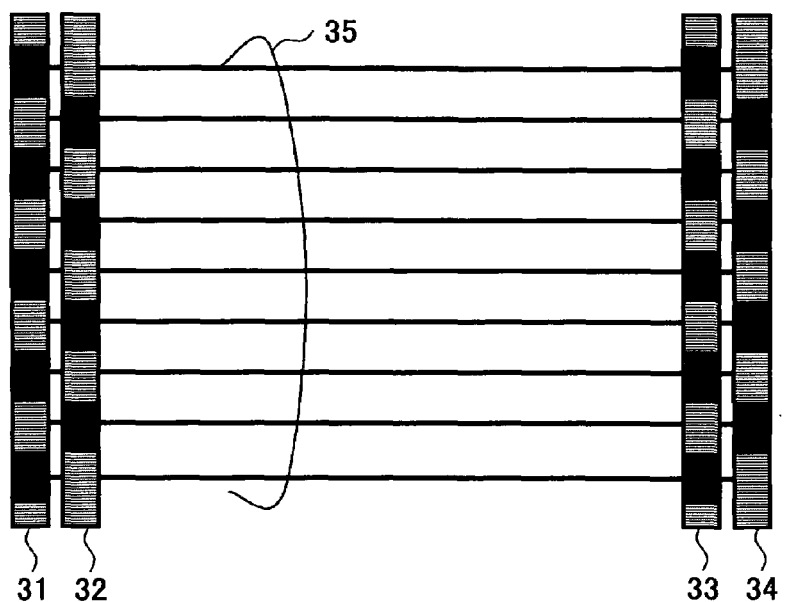
FIG. 6 is a drawing showing the power supply lines after the layout.

FIG. 6 is a drawing showing the power supply lines after the layout. Main power supply lines 31, 32, 33, and 34 (e.g., a portion of a power supply mesh) are illustrated, between which power supply lines 35 are placed. One of the main power supply lines 31 and 32 serves to supply a power supply potential VDD, and the other one serves to supply a ground potential VSS. By the same token, one of the main power supply lines 33 and 34 serves to supply the power supply potential VDD, and the other one serves to supply the ground potential VSS. The power supply lines 35 include lines for the power supply potential and lines for the ground potential, which are alternately arranged.

Turning to FIG. 1 again, at step S9, cell placement is performed. Namely, the dummy cells having the derived cell widths (and cells that did not need to be replaced with dummy cells) are automatically placed on the chip by an automatic layout tool. Since the dummy cells are increased in cell size in comparison with the original cells, an area where adjacent cells can be placed is increasingly restricted compared with the case of the original cells. Further, the cell size is responsive to the width of the area to which the power supply line supplies the power, the maximum tolerable current amount, and the amount of current consumed by the cell, so that the sum of the amounts of current consumed by the cells connected to the power supply line never exceeds the maximum tolerable current amount of the power supply line.

Figure 7:
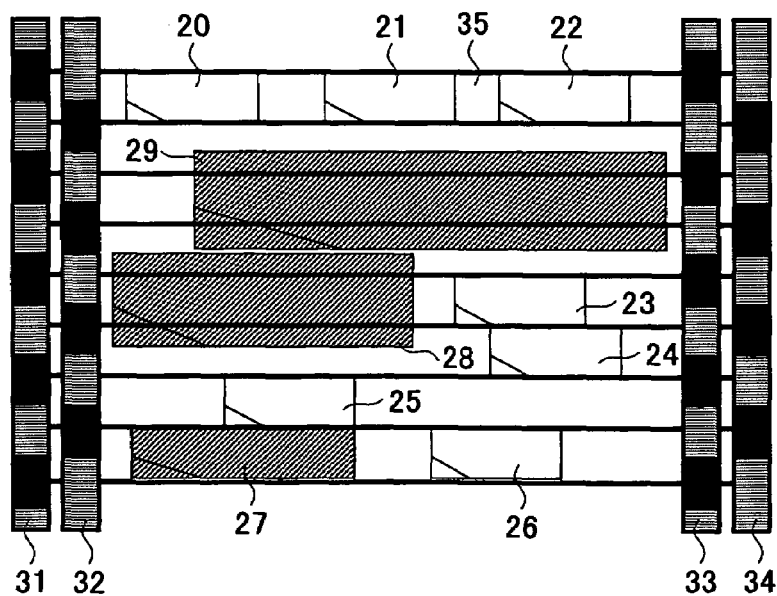
FIG. 7 is a drawing showing the way the cells inclusive of dummy cells are placed.

FIG. 7 is a drawing showing the way the cells inclusive of dummy cells are placed. In FIG. 7, the same elements as those of FIG. 6 are referred to by the same numerals, and a description thereof will be omitted.

The cells 20 through 29 inclusive of dummy cells shown in FIG. 7 correspond to the cells 20 through 29 shown in FIG. 5. As can be seen from FIG. 7, the amount of consumed current is small for the cells 20 through 22, for example, so that these three cells can be arranged in a single row along the power supply lines 15. The cell 27, however, consumes a large amount of current, and is thus replaced with a dummy cell having a proportionately wide cell width. As a result, the layout is such that the two cells 26 and 27 are arranged in a single row. As for the cells 28 and 29, not only the cell widths are increased, but also the cell heights are increased, so that no other cells are placed in their proximity.

Turning to FIG. 1 again, at step S10, the dummy cells are exchanged with the original cells. Namely, the cells that were replaced with the dummy cells at step S6 are changed from the dummy cells used for the purpose of cell placement to the actual cells (i.e., the circuits achieving the functions of the cells).

Figure 8:
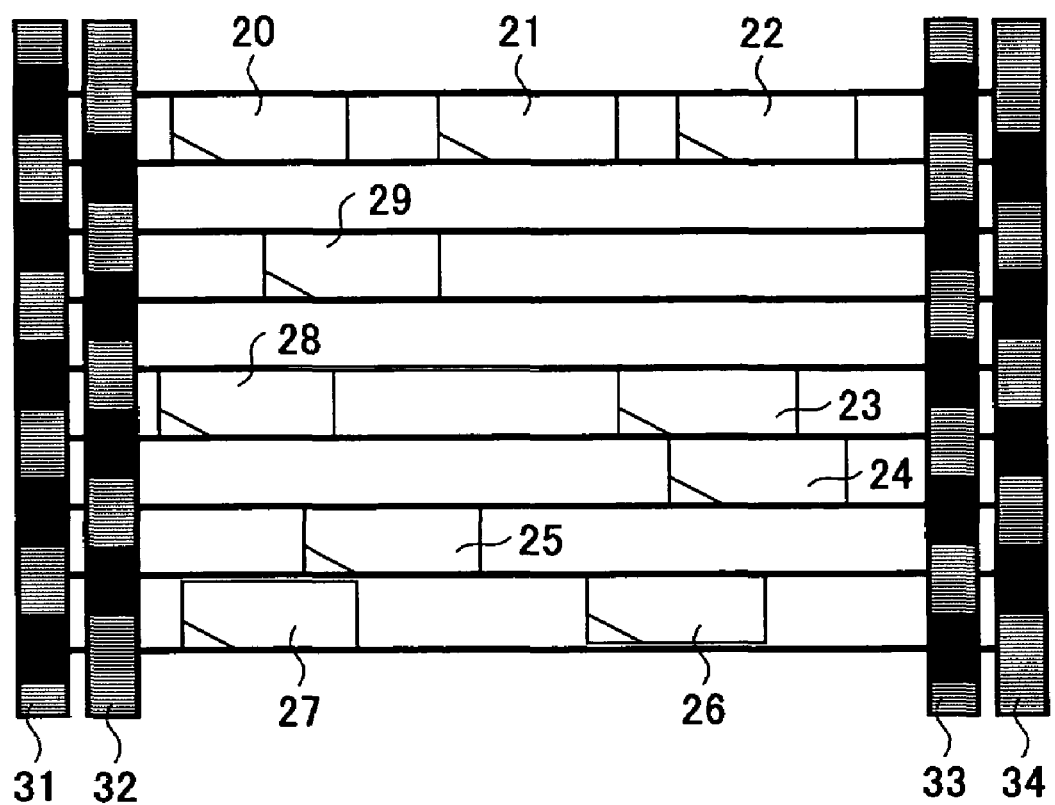
FIG. 8 is a drawing showing the arrangement of cells after the original cells are restored.

FIG. 8 is a drawing showing the arrangement of cells after the original cells are restored. In FIG. 8, the same elements as those of FIG. 6 and FIG. 7 are referred to by the same numerals, and a description thereof will be omitted.

The cells 20 through 29 inclusive of dummy cells shown in FIG. 8 correspond to the cells 20 through 29 shown in FIG. 7. With respect to the cells 27 through 29 for which cell placement was performed by use of dummy cells, the original cells (i.e., the actual circuits achieving the functions of the cells) are restored by replacing the dummy cells. With this provision, layout data defining the cell placement of actual cells is obtained.

Figure 9:
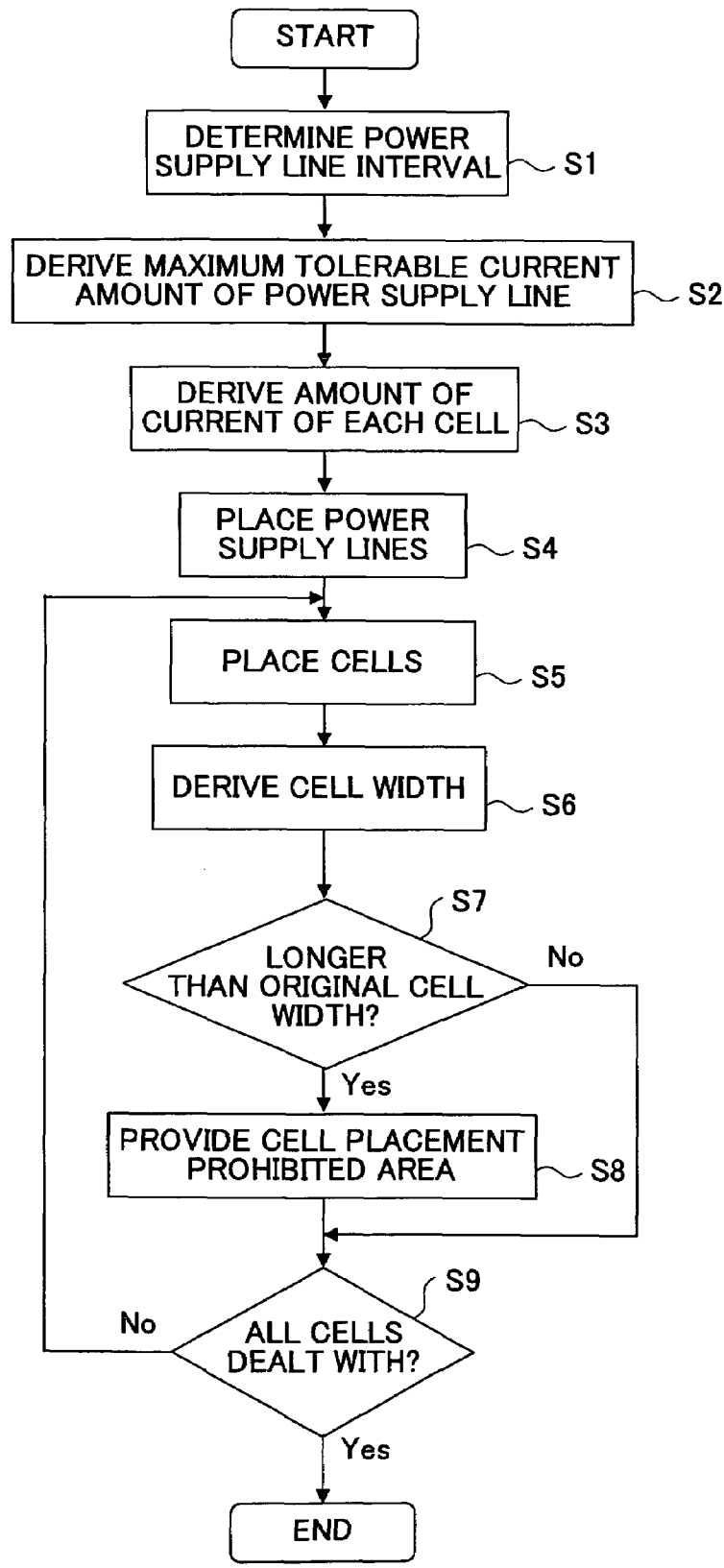
FIG. 9 is a flowchart showing a second embodiment of a cell placement method according to the present invention.

FIG. 9 is a flowchart showing a second embodiment of a cell placement method according to the present invention. At step S1, the interval of power supply lines is determined. At step S2, the maximum tolerable current amount is calculated with respect to power supply lines. At step S3, the amount of current of each cell is calculated. The processes of these steps are identical to those of the steps S1 through S3 shown in FIG. 1, respectively.

In the second embodiment, power supply lines and cells are placed without replacing cells with dummy cells. At step S4, power supply lines are laid out. In so doing, the power supply lines are laid out so as to conform to the conditions of the power supply line interval and the power supply line width determined at steps S1 and S2, respectively. As a result, the power supply lines after layout is obtained as shown in FIG. 6 in the same manner as in the first embodiment.

At step S5, a cell of interest is placed. This cell is an actual cell (i.e., circuit actually used to perform the function of the cell), which has an actual size.

Figure 10:
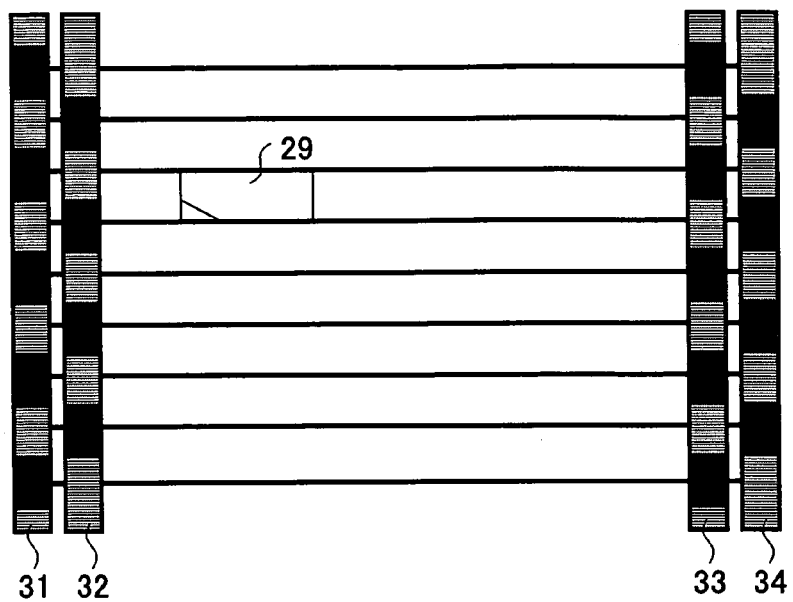
FIG. 10 is a drawing showing the way the cell of interest is placed.

FIG. 10 is a drawing showing the way the cell of interest is placed. In FIG. 10, the same elements as those of FIG. 6 are referred to by the same numerals, and a description thereof will be omitted. In the example of FIG. 10, the cell 29 shown in FIG. 3 is placed first as the cell of interest.

Thereafter, at step S6, the width of the cell of interest is derived. The method of deriving the cell width is the same as in the first embodiment. Namely, the relationship between the current consumed by cell and the cell width as shown in FIG. 4 may be provided as a table or the like. The table is referred to by use of the derived value of the amount of current consumed by the cell of interest, thereby identifying the cell width corresponding to the amount of the consumed current. It should be noted that such cell width decreases as the maximum tolerable current amount increases, and increases as the power supply line interval L increases. In order to implement the relationships between the derived cell width, the maximum tolerable current amount, and the power supply line interval L, the slope of the line specifying the relationship between the current consumed by cell and the cell width as shown in FIG. 4 may be adjusted in response to the maximum tolerable current amount and the power supply line interval L.

At step S7, a check is made as to whether the derived cell width is wider than the original cell width. Namely, the width of the actual cell of the cell of interest is compared with the cell width derived at step S6, thereby determining which is wider. If the derived cell width is broader than the original cell width, a cell placement prohibited area is provided around the cell of interest at step S8. The width of this cell placement prohibited area is identical to the cell width derived at step S6. If the derived cell width is not broader than the original cell width, the provision of the cell placement prohibited area at step S8 is skipped.

Figure 11:
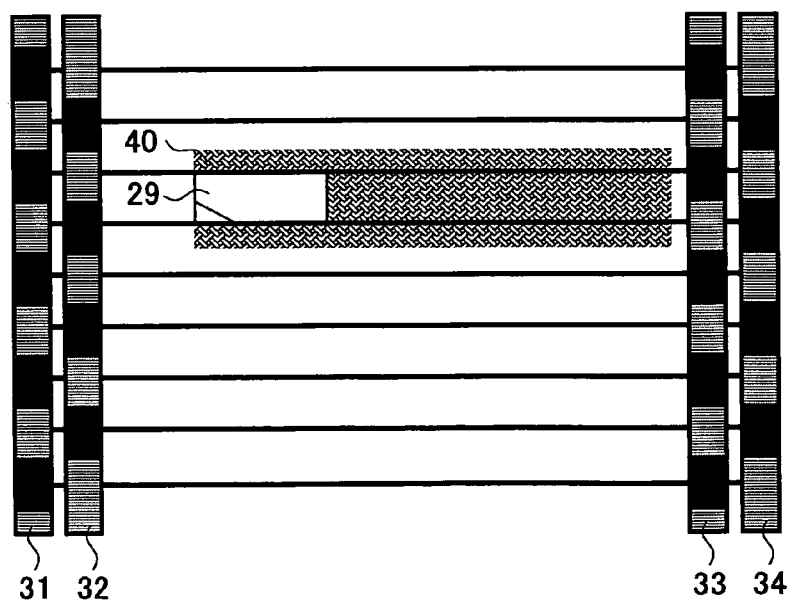
FIG. 11 is a drawing for explaining the provision of the cell placement prohibited area.

FIG. 11 is a drawing for explaining the provision of the cell placement prohibited area. In FIG. 11, the same elements as those of FIG. 10 are referred to by the same numerals, and a description thereof will be omitted. In the example shown in FIG. 11, a cell placement prohibited area 40 is provided with respect to the cell of interest 29. The cell placement prohibited area 40 is the same size as the cell (dummy cell) 29 shown in FIG. 5. The provision of the cell placement prohibited area 40 in this manner makes it possible to prevent other cells from being placed in proximity to the cell 29 consuming a large amount of current. As in the first embodiment, the height of a cell placement prohibited area may be increased if the derived width is broader than a predetermined width (e.g., ½ of the power supply line interval L). In this case, if the derived width is not broader than the predetermined width (e.g., ½ of the power supply line interval L), the height of the cell placement prohibited area remains the same as that of the original cell.

Turning to FIG. 9 again, at step S9, a check is made as to whether the processes of steps S5 through S8 are performed with respect to all the cells. If there is a cell yet to be processed, such an unprocessed cell is treated as a cell of interest, and the processes of the steps S5 through S8 will be performed. If the processes are completed with respect to all the cells, the procedure proceeds to step S8.

Figure 12:
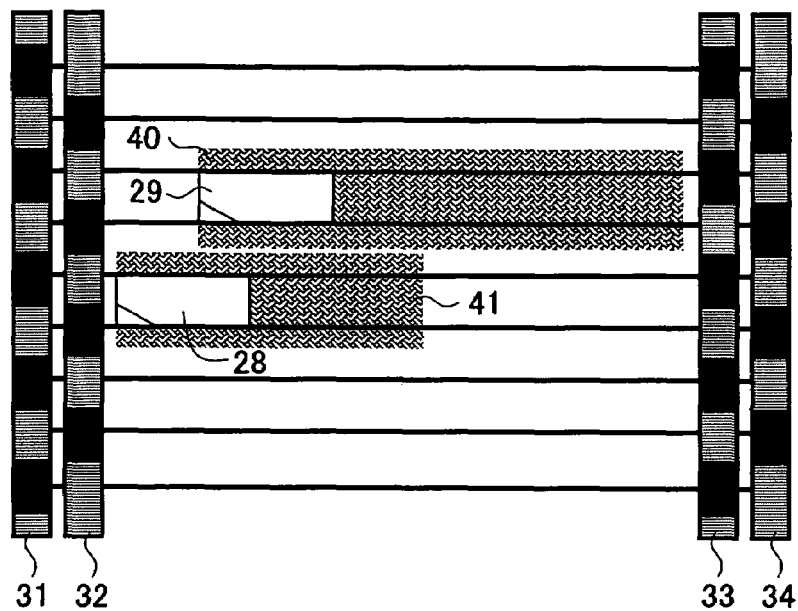
FIG. 12 is a drawing showing the way the second cell of interest is placed and a cell placement prohibited area is provided.

FIG. 12 is a drawing showing the way the second cell of interest is placed and a cell placement prohibited area is provided. In FIG. 12, the same elements as those of FIG. 11 are referred to by the same numerals, and a description thereof will be omitted. In the example shown in FIG. 12, the cell of interest 28 is placed after the cell 29, and a cell placement prohibited area 41 is provided with respect to the cell of interest 28. The cell placement prohibited area 41 is the same size as the cell (dummy cell) 28 shown in FIG. 5.

Figure 13:
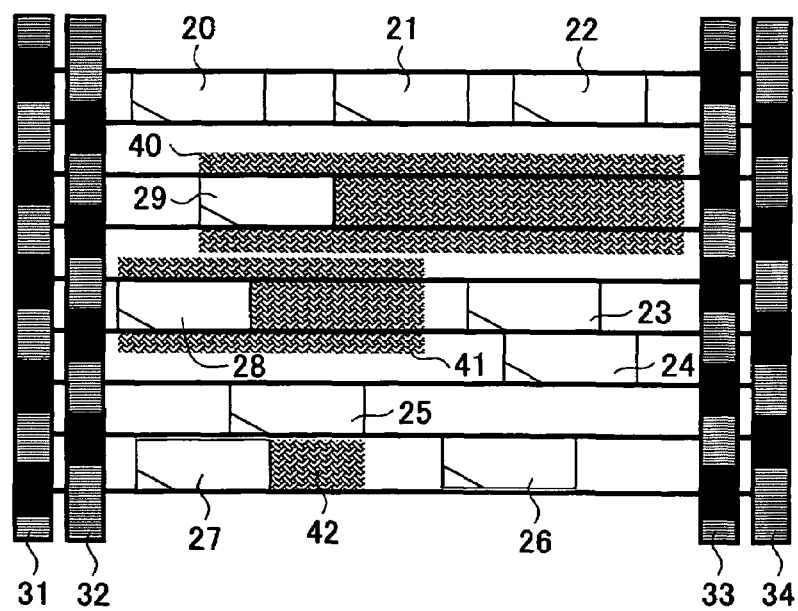
FIG. 13 is a drawing showing the way the placement of all the cells is completed.

FIG. 13 is a drawing showing the way the placement of all the cells is completed. In FIG. 13, the same elements as those of FIG. 11 are referred to by the same numerals, and a description thereof will be omitted. In the example shown in FIG. 13, all the cells 20 through 29 are placed. The cells 29, 28, and 27 are provided with the cell placement prohibited areas 40, 41, 42, respectively, so that other cells are not placed in their proximities. The size of each cell placement prohibited area is determined in response to the width of the area to which the power supply line supplies the power, the maximum tolerable current amount, and the amount of current consumed by the cell, so that the sum of the amounts of current consumed by the cells connected to the power supply line never exceeds the maximum tolerable current amount of the power supply line.

Figure 14:
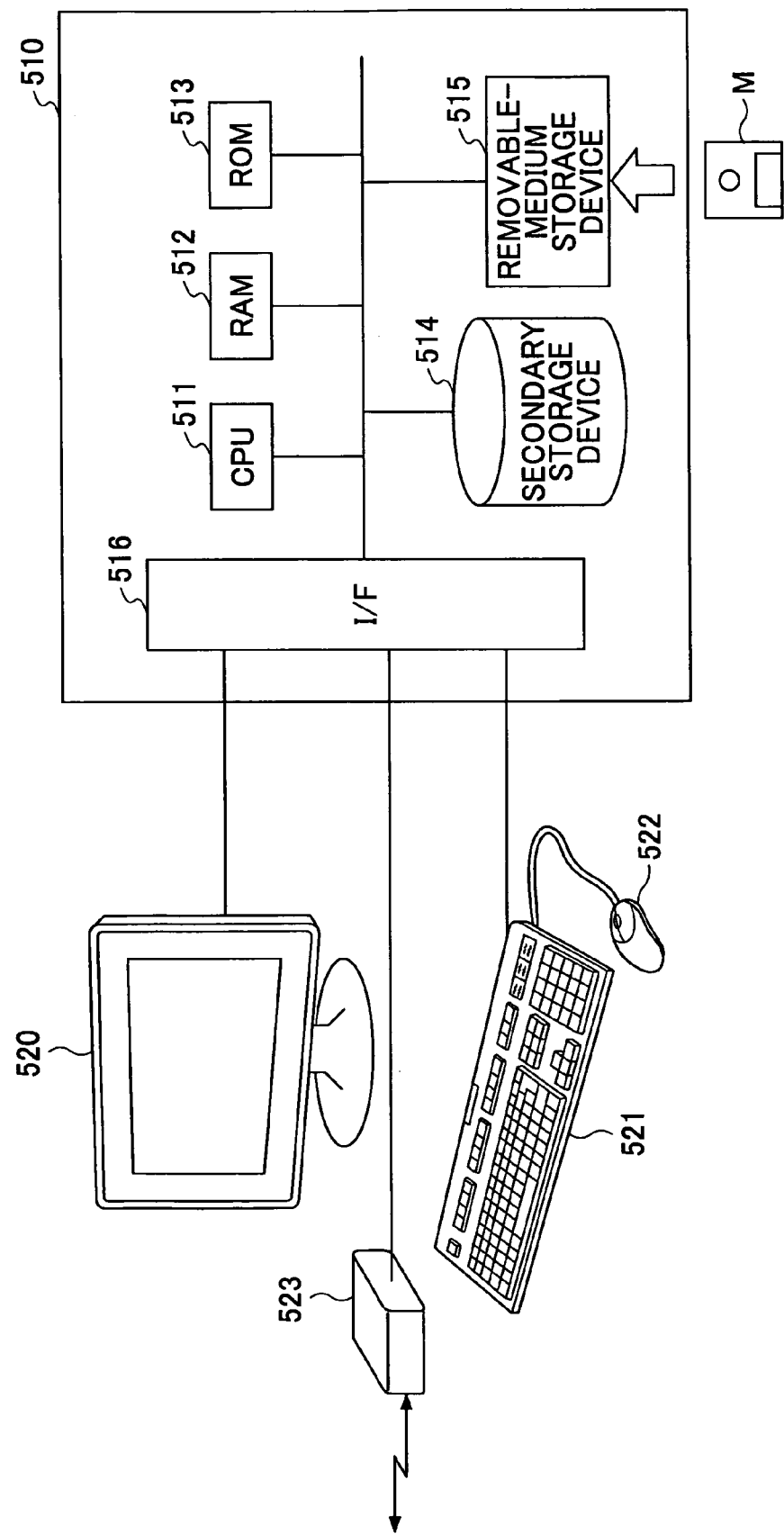
FIG. 14 is a drawing showing the configuration of an apparatus for performing the cell placement method according to the present invention.

FIG. 14 is a drawing showing the configuration of an apparatus for performing the cell placement method according to the present invention.

As shown in FIG. 14, the apparatus (CAD system) for performing the cell placement method according to the present invention is implemented as a computer such as a personal computer, an engineering workstation, or the like. The apparatus of FIG. 14 includes a computer 510, a display apparatus 520 connected to the computer 510, a communication apparatus 523, and an input apparatus. The input apparatus includes a keyboard 521 and a mouse 522. The computer 510 includes a CPU 511, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to communicate with the computer 510. The communication apparatus 523 provides for communication to be conduced with a remote site, and may include a modem, a network interface, or the like.

The cell placement method according to the present invention is provided as a computer program executable by the computer 510. This computer program is stored in a memory medium M that is mountable to the removable-medium storage device 515. The computer program is loaded to the RAM 512 or to the secondary storage device 514 from the memory medium M through the removable-medium storage device 515. Alternatively, the computer program may be stored in a remote memory medium (not shown), and is loaded to the RAM 512 or to the secondary storage device 514 from the remote memory medium through the communication apparatus 523 and the interface 516.

Upon user instruction for program execution entered through the keyboard 521 and/or the mouse 522, the CPU 511 loads the program to the RAM 512 from the memory medium M, the remote memory medium, or the secondary storage device 514. The CPU 511 executes the program loaded to the RAM 512 by use of an available memory space of the RAM 512 as a work area, and continues processing while communicating with the user as such a need arises. The ROM 513 stores therein control programs for the purpose of controlling basic operations of the computer 510.

By executing the computer program as described above, the computer 510 performs the cell placement method as described in the embodiments.

Figure 15:
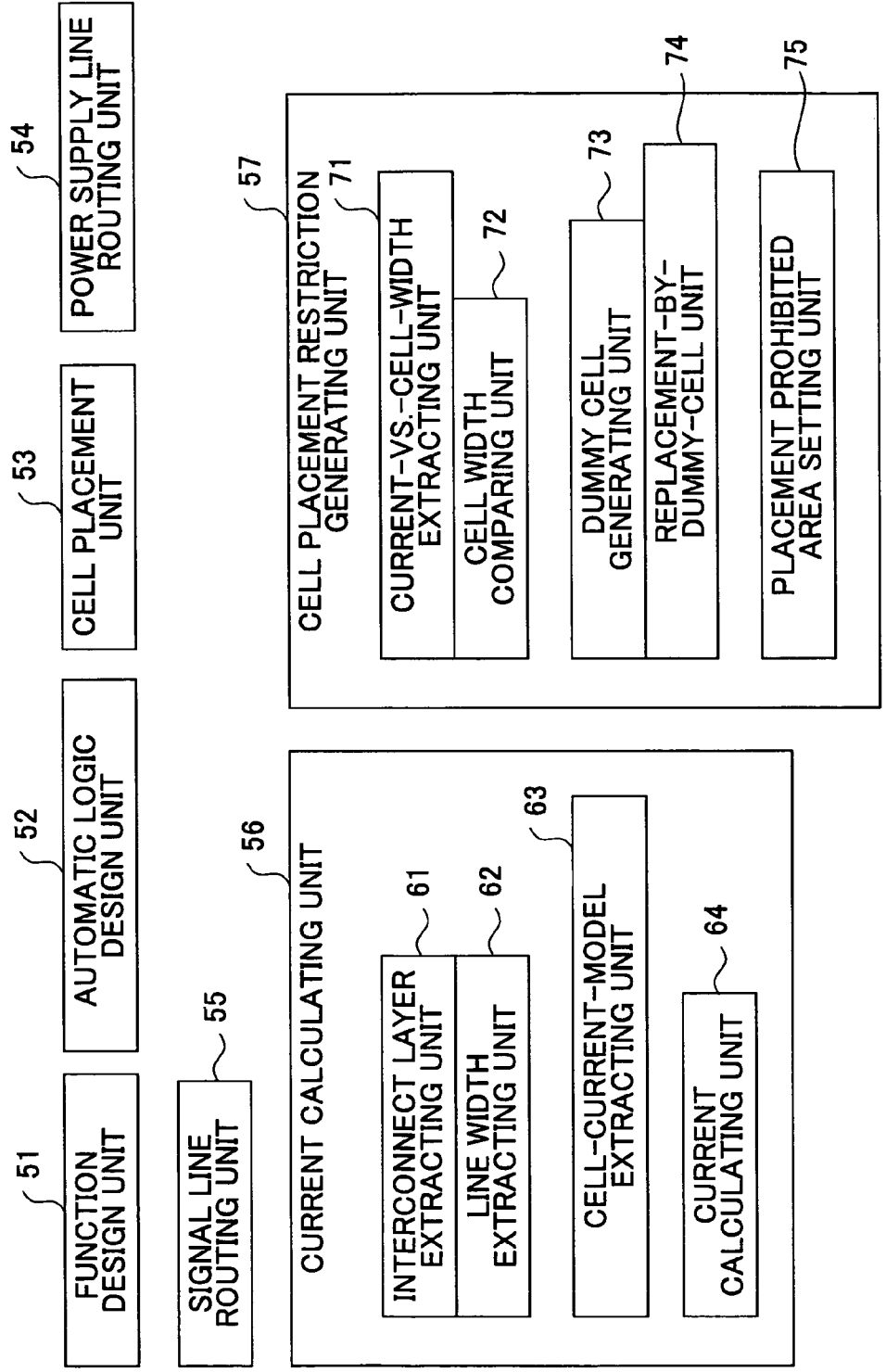
FIG. 15 is a functional block diagram showing the configuration of software for implementing the cell placement method according to the present invention.

FIG. 15 is a functional block diagram showing the configuration of software for implementing the cell placement method according to the present invention. The software shown in FIG. 15 is for use in a CAD system including the CAD functions concerning the cell placement method of the present invention, and includes a function design unit 51, an automatic logic design unit 52, a cell placement unit 53, a power supply line routing unit 54, a signal line routing unit 55, a current calculating unit 56, and a cell placement restriction generating unit 57. Various other functional units are provided in the software of a general CAD system. Since these functional units are not directly related to the present invention, a description thereof will be omitted.

The function design unit 51 is a tool used to functionally describe the behavior of a circuit to be designed. The automatic logic design unit 52 generates a net list defining the cells constituting the circuit to be designed and the interconnections between the cells based on the behavior of the circuit described by the function design unit 51. The cell placement unit 53 automatically places the cells of the net list on the chip. The power supply line routing unit 54 and the signal line routing unit 55 lay out power supply lines and signal lines, respectively.

The current calculating unit 56 includes an interconnect layer extracting unit 61, a line width extracting unit 62, a cell-current-model extracting unit 63, and a current calculating unit 64. The interconnect layer extracting unit 61 and the line width extracting unit 62 extract the layers of the power supply lines and the width of the power supply lines, respectively, for storage in memory. The cell-current-model extracting unit 63 extracts an electric current model of the cell of interest for storage in memory. The current calculating unit 64 calculates the amount of current consumed by each cell based on the information extracted by the cell-current-model extracting unit 63 and external information (an operating frequency, operating rates, and so on).

The cell placement restriction generating unit 57 includes a current-vs.-cell-width extracting unit 71, a cell width comparing unit 72, a dummy cell generating unit 73, a replacement-by-dummy-cell unit 74, and a placement prohibited area setting unit 75. The current-vs.-cell-width extracting unit 71 refers to the table that stores a correspondence relationship between consumed current and cell width so as to extract a cell width corresponding to a given amount of consumed current for storage in memory. The cell width comparing unit 72 compares the cell width of the cell of interest with the cell width extracted by the current-vs.-cell-width extracting unit 71, and stores the result of comparison in memory. The dummy cell generating unit 73 generates a dummy cell for storage in memory based on the result of comparison made by the cell width comparing unit 72. The replacement-by-dummy-cell unit 74 replaces the cell of interest in the net list with a dummy cell if the cell is found to be in need to be replaced with a dummy cell. The placement prohibited area setting unit 75 sets a placement prohibited area for storage in memory based on the result of comparison made by the cell width comparing unit 72.

Further, the present invention is not limited to these embodiments, but various variations and modifications may be made without departing from the scope of the present invention.

What is claimed is:

1. A computer-readable record medium having a program embodied therein for causing a computer to place cells, said program comprising codes for causing the computer to perform:
    deriving an amount of current consumed by each cell constituting a net list;
    placing a cell of interest in a layout plane while securing around the cell of interest an area having a size that is responsive to the derived amount of current consumed by the cell of interest and the size of the area is larger than an actual size of the cell of interest; and
    placing other cells such that any cells other than the cell of interest are not placed in the area,
    wherein the area is secured by placing a dummy cell as the cell of interest, the dummy cell having the size that is responsive to the derived amount of current consumed by the cell of interest.

2. A computer-readable record medium having a program embodied therein for causing a computer to place cells, said program comprising codes for causing the computer to perform:
    deriving an amount of current consumed by each cell constituting a net list;
    then placing a cell of interest in a layout plane as an initial placement of the cell of interest in the layout plane while securing around the cell of interest an area having a size that is responsive to the derived amount of current consumed by the cell of interest and the size of the area is larger than an actual size of the cell of interest; and
    placing other cells such that any cells other than the cell of interest are not placed in the area.

3. The computer-readable record medium as claimed in claim 2, wherein the area having the size that is responsive to the derived amount of current consumed by the cell of interest is provided as a placement prohibited area, such that other cells are prohibited from being placed in the placement prohibited area.

4. The computer-readable record medium as claimed in claim 1, wherein a maximum tolerable current amount is derived as a maximum amount of current that is allowed to flow through a power supply line for supplying a power to a given region in the layout plane, and the size of the area is made to change in response to the maximum tolerable current amount and an area size of the given region.

5. An apparatus for placing cells, comprising:
    a memory to store information about a circuit to be designed and a cell placement program; and
    a computation unit to execute the cell placement program stored in the memory so as to place cells of the circuit to be designed in a layout plane by use of the information stored in the memory,
    wherein the computation unit executes the cell placement program to perform:
    deriving an amount of current consumed by each cell constituting the circuit to be designed;
    then placing a cell of interest in the layout plane while securing around the cell of interest an area having a size that is responsive to the derived amount of current consumed by the cell of interest and the size of the area is larger than an actual size of the cell of interest; and
    placing other cells such that any cells other than the cell of interest are not placed in the area,
    wherein the area is secured by placing a dummy cell as the cell of interest, the dummy cell having the size that is responsive to the derived amount of current consumed by the cell of interest.

6. An apparatus for placing cells, comprising:
    a memory to store information about a circuit to be designed and a cell placement program; and
    a computation unit to execute the cell placement program stored in the memory so as to place cells of the circuit to be designed in a layout plane by use of the information stored in the memory,
    wherein the computation unit executes the cell placement program to perform:
    deriving an amount of current consumed by each cell constituting the circuit to be designed;
    then placing a cell of interest in the layout plane as an initial placement of the cell of interest in the layout plane while securing around the cell of interest an area having a size that is responsive to the derived amount of current consumed by the cell of interest and the size of the area is larger than an actual size of the cell of interest; and
    placing other cells such that any cells other than the cell of interest are not placed in the area.

7. The apparatus as claimed in claim 6, wherein the area having the size that is responsive to the derived amount of current consumed by the cell of interest is provided as a placement prohibited area, such that other cells are prohibited from being placed in the placement prohibited area.

8. The apparatus as claimed in claim 6, wherein a maximum tolerable current amount is derived as a maximum amount of current that is allowed to flow through a power supply line for supplying a power to a given region in the layout plane, and the size of the area is made to change in response to the maximum tolerable current amount and an area size of the given region.

9. A method of placing cells executed by an apparatus, the method comprising:

deriving an amount of current consumed by each cell constituting a net list by a computing unit of the apparatus;

then placing a cell of interest in a layout plane as an initial placement of the cell of interest in the layout plane while securing around the cell of interest an area having a size that is responsive to the derived amount of current consumed by the cell of interest and that is larger than an actual size of the cell of interest; and placing other cells such that any cells other than the cell of interest are not placed in the area.

10. The method as claimed in claim 9, further comprising:

deriving a maximum tolerable current amount as a maximum amount of current that is allowed to flow through a power supply line for supplying a power to a given region in the layout plane; and changing the size of the area in response to the maximum tolerable current amount and an area size of the given region.

* * * * *